(12) United States Patent
Dark et al.

(10) Patent No.: US 7,488,647 B1
(45) Date of Patent: Feb. 10, 2009

(54) SYSTEM AND METHOD FOR PROVIDING A POLY CAP AND A NO FIELD OXIDE AREA TO PREVENT FORMATION OF A VERTICAL BIRD'S BEAK STRUCTURE IN THE MANUFACTURE OF A SEMICONDUCTOR DEVICE

(75) Inventors: Charles A. Dark, Arlington, TX (US); Andy Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 3 days.

(21) Appl. No.: 11/201,761

(22) Filed: Aug. 11, 2005

(51) Int. Cl.
*H01L 21/336* (2006.01)
*H01L 21/76* (2006.01)
*H01L 21/4763* (2006.01)

(52) U.S. Cl. .................. 438/259; 438/270; 438/297; 438/430; 438/439; 438/589; 257/E21.429; 257/E21.629

(58) Field of Classification Search .......... 438/259, 438/270, 297, 430, 589, 439; 257/E21.429, 257/E21.629
See application file for complete search history.

(56) References Cited

U.S. PATENT DOCUMENTS

| | | | |
|---|---|---|---|
| 4,631,803 A | 12/1986 | Hunter et al. | |
| 4,835,115 A | 5/1989 | Eklund | |
| 5,106,777 A | 4/1992 | Rodder | |
| 5,378,655 A * | 1/1995 | Hutchings et al. | 438/138 |
| 5,480,832 A | 1/1996 | Miura et al. | |
| 6,362,025 B1 * | 3/2002 | Patti et al. | 438/138 |
| 6,376,315 B1 * | 4/2002 | Hshieh et al. | 438/270 |
| 6,515,338 B1 * | 2/2003 | Inumiya et al. | 257/368 |
| 6,693,026 B2 * | 2/2004 | Kim | 438/589 |
| 6,707,100 B2 * | 3/2004 | Gajda | 257/330 |
| 6,780,732 B2 * | 8/2004 | Durcan et al. | 438/430 |
| 6,855,604 B2 * | 2/2005 | Lee | 438/270 |
| 6,933,196 B2 * | 8/2005 | Back | 438/259 |
| 2005/0151188 A1 * | 7/2005 | Nakamura | 257/330 |

FOREIGN PATENT DOCUMENTS

JP    410247655 A   *   9/1998

OTHER PUBLICATIONS

Fanling Yang et al., "Characterization of Collector-Emitter Leakage in Self-Aligned Double-Poly Bipolar Junction Transistors", Tektronix Incorporated, Integrated Circuit Operations, Beaverton, Oregon 97077, J. Electrochem. Soc., vol. 140, No. 10, Oct. 1993, The Electrochemical Society, Inc., pp. 3033-3037.

* cited by examiner

*Primary Examiner*—Walter L Lindsay, Jr.
*Assistant Examiner*—Ron E Pompey

(57) ABSTRACT

A system and method is disclosed that prevents the formation of a vertical bird's beak structure in the manufacture of a semiconductor device. A polysilicon filled trench is formed in a substrate of the semiconductor device. One or more composite layers are then applied over the trench and the substrate. A mask and etch process is then applied to etch the composite layers adjacent to the polysilicon filled trench. A field oxide process is applied to form field oxide portions in the substrate adjacent to the trench. Because no field oxide is placed over the trench there is no formation of a vertical bird's beak structure. A gate oxide layer is applied and a protection cap is formed over the polysilicon filled trench to protect the trench from unwanted effects of subsequent processing steps.

20 Claims, 4 Drawing Sheets

US 7,488,647 B1

SYSTEM AND METHOD FOR PROVIDING A POLY CAP AND A NO FIELD OXIDE AREA TO PREVENT FORMATION OF A VERTICAL BIRD'S BEAK STRUCTURE IN THE MANUFACTURE OF A SEMICONDUCTOR DEVICE

RELATED PATENT APPLICATION

The present invention is related to the invention disclosed and claimed in U.S. patent application Ser. No. 11/201,926 filed concurrently with the present patent application.

TECHNICAL FIELD OF THE INVENTION

The present invention relates generally to the manufacture of semiconductor devices and, more particularly, to a system and method for preventing the formation of a vertical bird's beak structure during a manufacturing process of a semiconductor device.

BACKGROUND OF THE INVENTION

Some types of semiconductor manufacturing processes utilize a polysilicon buffered LOCOS (Local Oxidation of Silicon) field oxidation process to provide device-to-device isolation in conjunction with a deep polysilicon filled trench. A standard prior art technique comprises growing field oxide over a polysilicon filled trench to isolate the trench polysilicon from further processing. This type of manufacturing process creates a vertical bird's beak structure on both sides of the trench where the liner oxide of the trench intersects with the surface.

It has been shown that the presence of a vertical bird's beak structure is a very significant contributor to creating additional stress in the silicon due to the expansion of the silicon dioxide in the confined trench liner region near the surface. The expansion of the liner oxide region causes compressive stress in the silicon surrounding the trench. This stress can be transmitted downwardly into the silicon bulk.

There have been prior art attempts to minimize the amount of stress that is produced by a vertical bird's beak structure. For example, a paper by Yang et al. entitled "Characterization of Collector-Emitter Leakage in Self-Aligned Double-Poly Bipolar Junction Transistors", 140 J. Electrochem. Soc. 3033-3037 (October 1993), suggests that the stress produced by the volume expansion from oxidation can be reduced by minimizing the size of the vertical bird's beak structure.

This can be achieved by reducing the deep trench surface oxide thickness (as long as adequate isolation can still be provided). To improve the quality of isolation oxide, a sacrificial layer can be grown and stripped off before the final layer is grown. The corner of the trench can be rounded off to reduce the stress that is generated due to volume misfit of the growing oxide.

The oxidation conditions, on the other hand, can be varied to relieve the oxide stress through the viscous elastic flow of the oxide. Variations in process conditions, such as the mixture of oxidation gas or oxidation temperature will affect the properties of the grown oxide as well as the generated defects.

The paper by Yang et al. also states that at higher oxidation temperature, the grown oxide has the ability to redistribute itself (due to lower viscosity) and thereby reduce the amount of stress on the neighboring silicon region.

This approach and others similar to it are directed at minimizing the stress that is due to the presence of the vertical bird's beak structure. It would be advantageous to have a system and method that would prevent the formation of a vertical bird's beak structure in the first place during the manufacture of a semiconductor device.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented for any type of suitably arranged semiconductor device.

Figure 1:
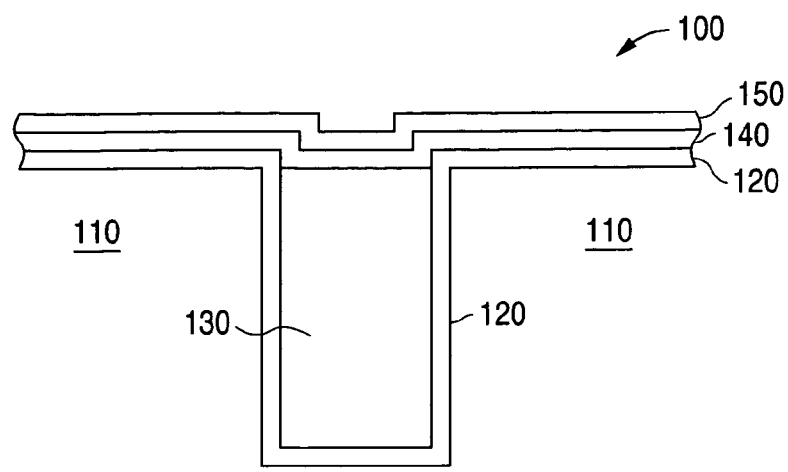
FIGS. 1 through 4 illustrate stages of manufacture of a prior art polysilicon filled trench in which a vertical bird's beak structure is created.

FIG. 1 is a diagram 100 illustrating a cross sectional view of a polysilicon filled trench in a substrate of a semiconductor device. Using conventional methods an isolation trench is etched in substrate 110. Then a liner oxide layer 120 is formed on the walls of the trench. The trench is then filled with polysilicon 130. Additional layers of material, 140 and 150, are then applied over the oxide layer 120 to cover the polysilicon filled trench. The layers 120, 140 and 150 may be collectively referred to as composite layers.

Figure 2:
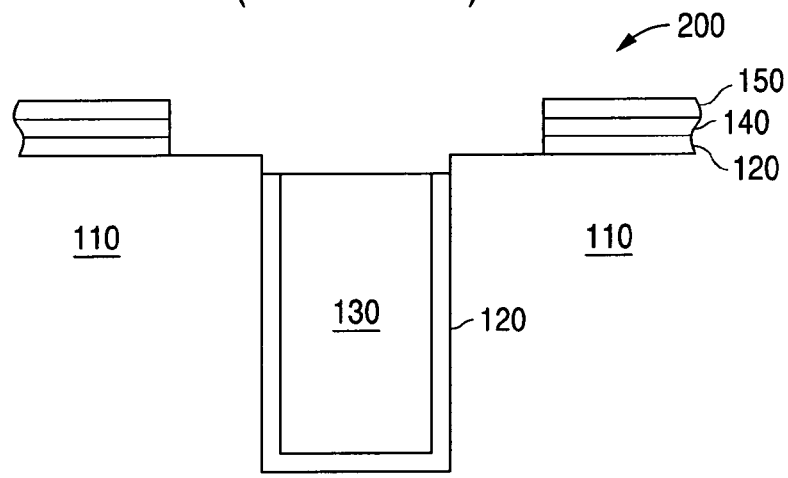

FIG. 2 illustrates the result of applying a mask and etch process to etch the composite layers 120, 140 and 150 over the polysilicon filled trench. The resulting structure 200 is then subjected to a field oxide process to grow a field oxide 310 over the polysilicon filled trench. The presence of the field oxide 310 over the polysilicon filled trench is to isolate the polysilicon 130 in the trench from further processing. This prior art method creates a vertical bird's beak structure where the liner oxide 120 intersects with the field oxide 310 at the top of the trench. The vertical bird's beak structure contributes to additional stress in the silicon due to the expansion of the material of liner oxide 120 near the top of the trench. The additional stress may form dislocation points and defects that will lead to junction leakage.

Figure 3:
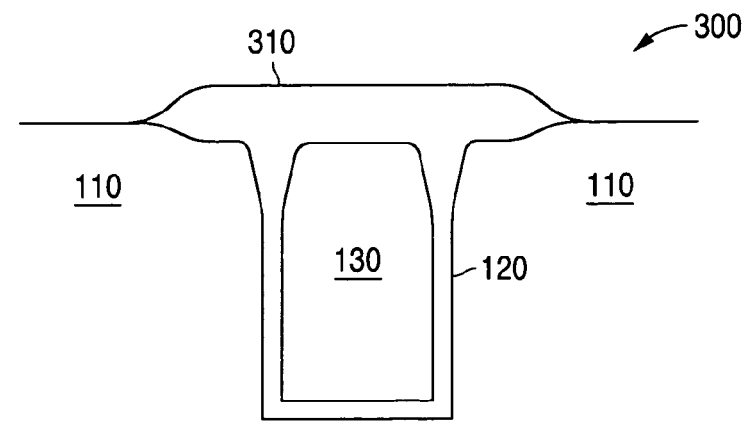
Figure 4:
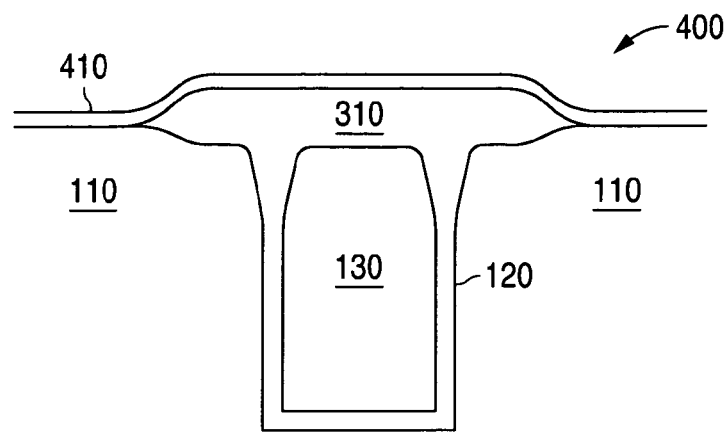

After the field oxide 310 has been formed, the composite layers 120, 140 and 150 on the substrate 110 are stripped away using conventional methods. FIG. 3 illustrates the resulting structure 300. Then a gate oxide process is applied to cover the structure 300 with a gate oxide layer 410. The resulting structure is designated with reference numeral 400.

Figure 5:
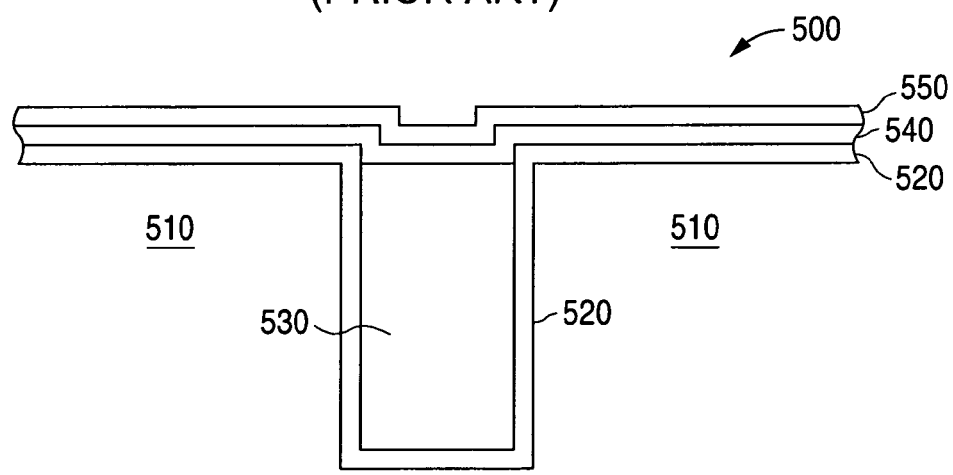
FIGS. 5 through 10 illustrate stages of manufacture of a polysilicon filled trench of the present invention in which a vertical bird's beak structure is not created.

In contrast to the prior art method, the method of the present invention does not create a vertical bird's beak structure. FIG. 5 illustrates the same structure as FIG. 1. FIG. 5 is a diagram 500 illustrating a cross sectional view of a polysilicon filled trench in a substrate of a semiconductor device. Using conventional methods an isolation trench is etched in substrate 510. Then a liner oxide layer 520 is formed on the walls of the trench. The trench is then filled with polysilicon 530. Additional layers of material, 540 and 550, are then applied over the oxide layer 520 to cover the polysilicon filled trench. The layers 520, 540 and 550 may be collectively referred to as composite layers.

Figure 6:
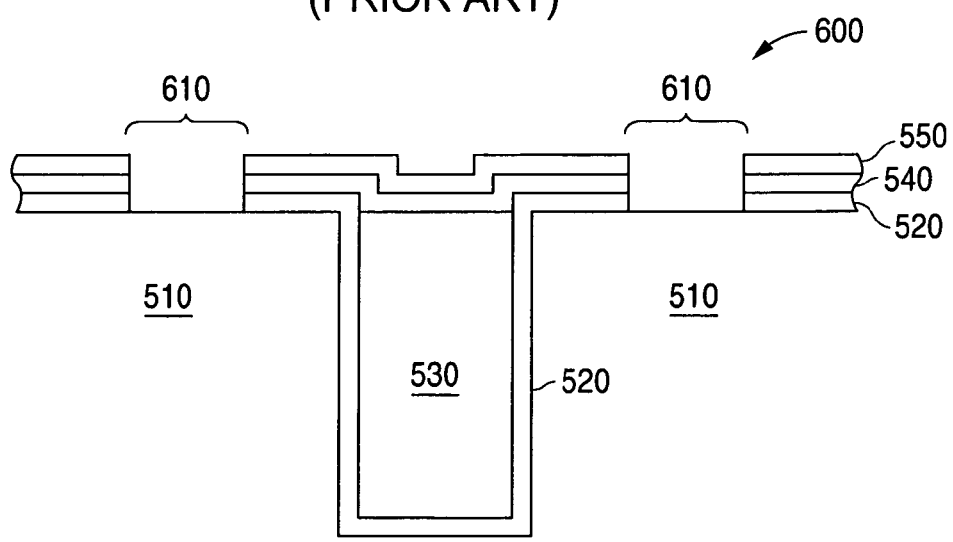

FIG. 6 illustrates the result of applying a mask and etch process to etch the composite layers 520, 540 and 550. As shown in FIG. 6, the composite layers 520, 540 and 550 are not etched over the polysilicon filled trench as in the prior art method. Instead the composite layers 520, 540 and 550 are etched at locations 610 that are adjacent to the polysilicon filled trench. The portions of the composite layers 520, 540 and 550 that are located over the polysilicon filled trench remain in place. This means that there will be no field oxide formed over the polysilicon filled trench. This will prevent the creation of a bird's beak structure and its attendant problems.

Figure 7:
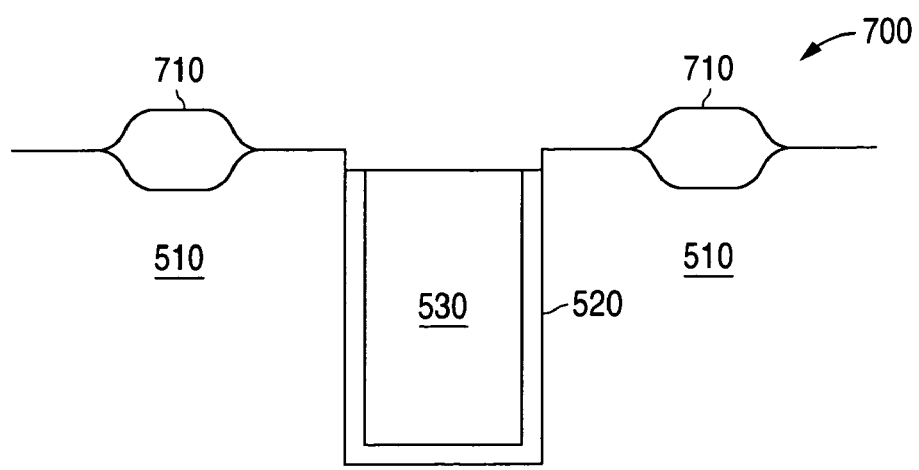

The structure 600 in FIG. 6 is then subjected to a field oxide process to grow a field oxide 710 in the locations that are adjacent to the polysilicon filled trench. After the field oxide 710 has been formed, the composite layers 520, 540 and 550 on the substrate 510 are stripped away using conventional methods. FIG. 7 illustrates the resulting structure 700.

Figure 8:
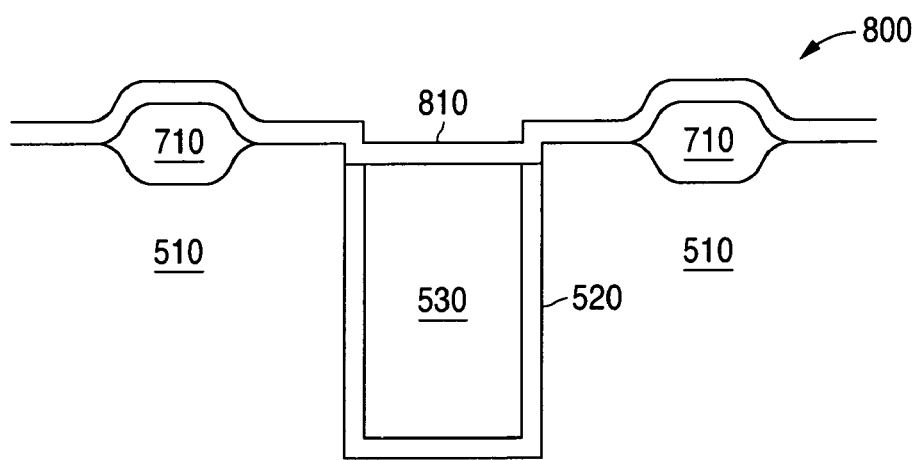

The polysilicon filled trench of the present invention does not experience the additional stress that is associated with the presence of a vertical bird's beak structure. However, at this stage the polysilicon filled trench will be susceptible to downstream process effects (e.g., silicide effects) that may lead to the formation of a conductive path across the trench liner oxide 520 to adjacent active circuitry. To avoid this problem, a gate oxide process is applied to cover the structure 700 with a gate oxide layer 810. As shown in FIG. 8, the resulting structure is designated with reference numeral 800.

The gate oxide layer 810 by itself is not sufficient to protect the polysilicon 530 in the trench from becoming silicided in subsequent processing steps because chemical cleaning may remove portions of the gate oxide layer 810. To further protect against the unwanted effects of a subsequent silicide process, a polysilicon protection cap 910 is formed over the polysilicon filled trench area to prevent the loss of the gate oxide layer 810 over the trench.

Figure 9:
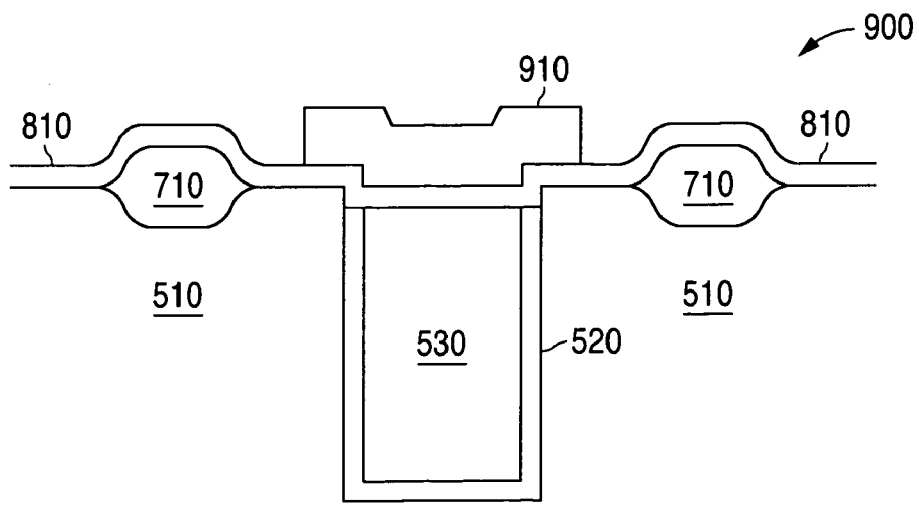

A mask and etch process is applied to form the polysilicon protection cap 910 as illustrated in FIG. 9. The polysilicon protection cap 910 is isolated from the polysilicon 530 in the trench by the gate oxide layer 810. In the embodiment illustrated in FIG. 9 the polysilicon protection cap 910 does not extend into the areas of the field oxide 710. In an alternate embodiment (not shown in FIG. 9) the material of the polysilicon protection cap 910 may extend over the areas of the field oxide 710.

Figure 10:
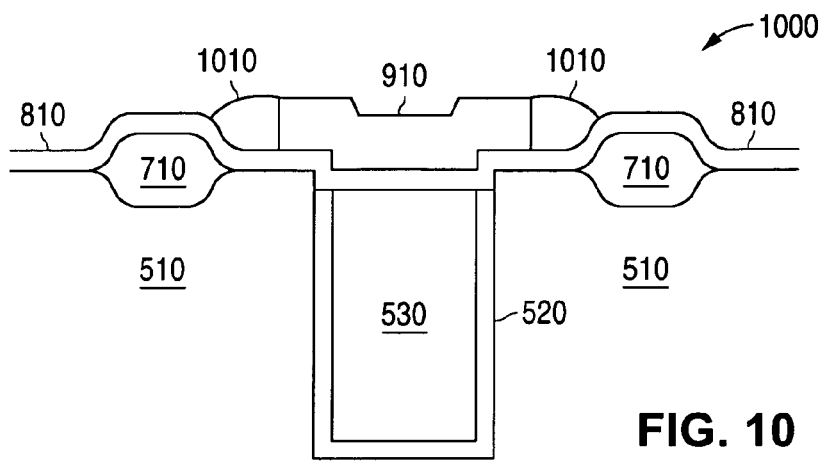

The polysilicon protection cap 910 may be isolated from the composite layers by spacer structures. An exemplary spacer oxide structure 1010 is shown in FIG. 10. The dimensions of the spacer oxide structure 1010 are large enough to prevent the polysilicon protection cap 910 from becoming a conduction path to adjacent active areas around the perimeter of the trench.

Figure 11:
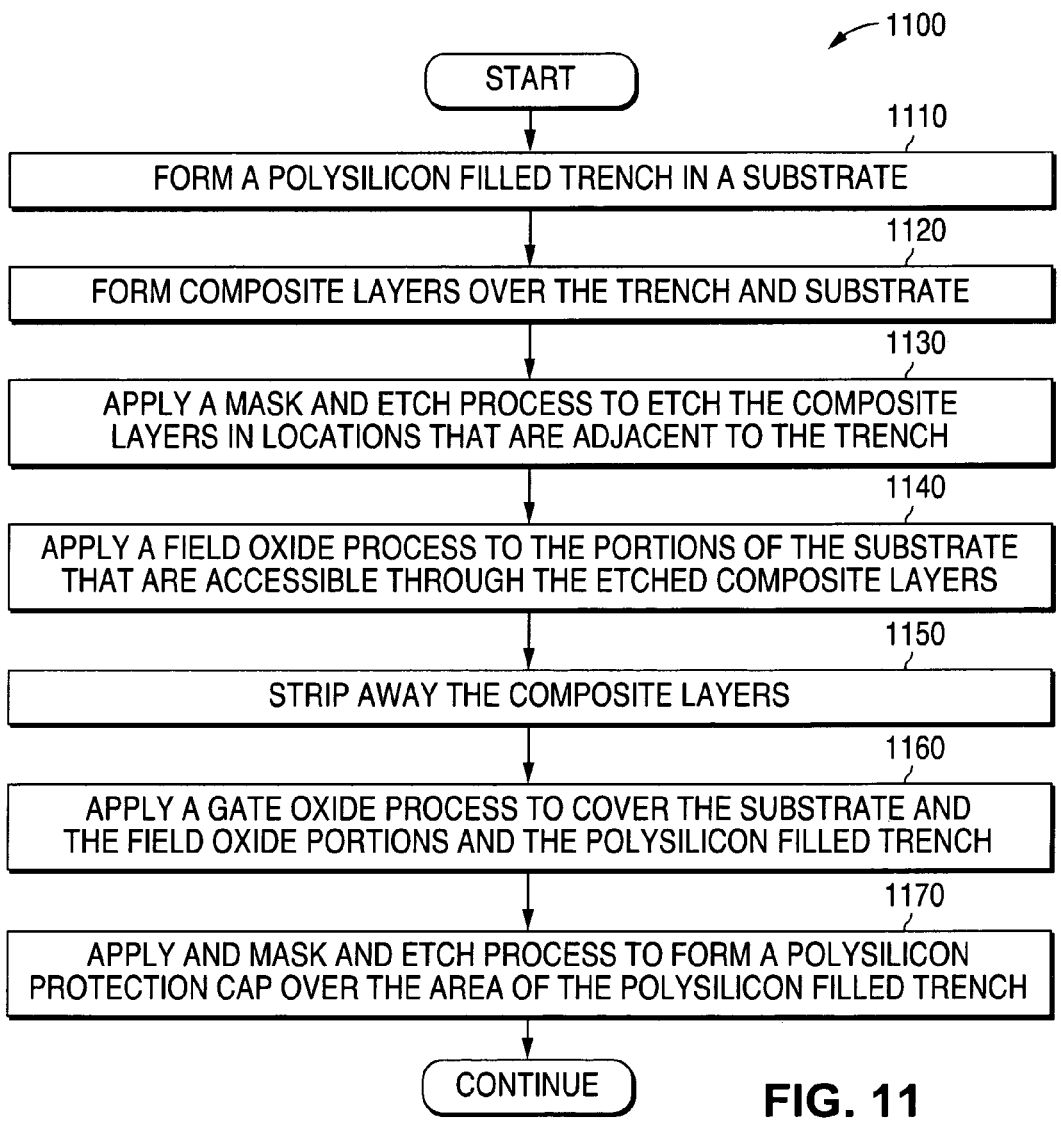
FIG. 11 is a flow chart showing the steps of an advantageous embodiment of a method of the present invention.

FIG. 11 is a flow chart 1100 showing the steps of an advantageous embodiment of a method of the present invention. In the first step of the method a polysilicon filled trench is formed in a substrate of a semiconductor device (step 1110). Then composite layers are formed over the trench and substrate (step 1120).

A mask and etch process is then applied to etch the composite layers in locations that are adjacent to the trench (step 1130). Then a field oxide process is applied to the portions of the substrate that are accessible through the etched composite layers (step 1140). Then the composite layers are stripped away (step 1150).

A gate oxide process is then applied to cover the substrate and the field oxide portions and the polysilicon filled trench (step 1160). Then a mask and etch process is applied to form a polysilicon protection cap over the area of the polysilicon filled trench (step 1170).

The system and method of the present invention provides several benefits. The first benefit is the elimination of the vertical bird's beak structure near the polysilicon filled trench. The second benefit is the elimination of the increased levels of stress in the silicon. The third benefit is the reduction of the trench to comp space. The fourth benefit is the elimination of trench to sinker (high dopant level) sensitivity.

Although the protection cap 910 of the invention has been described as being constructed of polysilicon, it is understood that the use of polysilicon to construct the protection cap is merely one example. It is understood that the principles of the invention are not limited to this particular embodiment. It is understood that in other embodiments the protection cap 910 may be constructed of any suitable protective material.

Although the present invention has been described with several embodiments, various changes and modifications may be suggested to one skilled in the art. It is intended that the present invention encompass such changes and modifications as fall within the scope of the appended claims.

What is claimed is:

1. A method for manufacturing a semiconductor device, said method comprising the steps of:
   providing a semiconductor device substrate;
   forming a polysilicon filled trench in said substrate;
   forming at least one composite layer over said trench and said substrate;
   applying a mask and etch process to etch said at least one composite layer in at least one location that is adjacent to said trench;
   applying a field oxide process to portions of said substrate that are exposed through said etched portions of said at least one composite layer; and
   preventing an increase in stress experienced by said polysilicon filled trench and experienced by said substrate by not placing field oxide over said polysilicon filled trench.

2. The method as set forth in claim 1 further comprising the step of:
   preventing a creation of a vertical bird's beak structure near said polysilicon filled trench by not placing field oxide over said polysilicon filled trench.

3. The method as set forth in claim 1 further comprising the steps of:
   removing unetched portions of said at least one composite layer; and forming a gate oxide layer over said substrate and said field oxide portions and said polysilicon filled trench.

4. The method as set forth in claim 3 further comprising the step of:
forming a polysilicon protection cap over said gate oxide layer over said polysilicon filled trench.

5. The method as set forth in claim 4 further comprising the step of:
preventing loss of portions of said gate oxide layer over said polysilicon filled trench by covering said portions of said gate oxide layer by said polysilicon protection cap.

6. The method as set forth in claim 4 further comprising the step of:
protecting said polysilicon filled trench against unwanted effects of a subsequent processing step by covering said polysilicon filled trench by said polysilicon protection cap.

7. The method as set forth in claim 6 wherein said subsequent processing step comprises silicidation.

8. The method as set forth in claim 7 wherein said unwanted effect of said silicidation processing step comprises silicidation of polysilicon material within said polysilicon filled trench.

9. The method as set forth in claim 4 further comprising the step of:
providing a spacer oxide to prevent said polysilicon protection cap from becoming a conduction path to active areas that are adjacent to said polysilicon filled trench.

10. A method for preventing formation of a vertical bird's beak structure in a semiconductor device, said method comprising the steps of:
providing a semiconductor device substrate;
forming a polysilicon filled trench in said substrate;
forming at least one composite layer over said trench and said substrate;
applying a mask and etch process to etch said at least one composite layer in at least one location that is adjacent to said trench;
applying a field oxide process to portions of said substrate that are exposed through said etched portions of said at least one composite layer; and
not placing field oxide over said polysilicon filled trench.

11. The method as set forth in claim 10 further comprising the steps of:
removing unetched portions of said at least one composite layer; and
forming a gate oxide layer over said substrate and said field oxide portions and said polysilicon filled trench.

12. The method as set forth in claim 11 further comprising the step of:
forming a polysilicon protection cap over said gate oxide layer over said polysilicon filled trench.

13. The method as set forth in claim 12 further comprising the steps of:

preventing loss of portions of said gate oxide layer over said polysilicon filled trench by covering said portions of said gate oxide layer by said polysilicon protection cap; and
protecting said polysilicon filled trench against unwanted effects of a subsequent processing step by covering said polysilicon filled trench by said polysilicon protection cap.

14. A method for manufacturing a semiconductor device, the method comprising the steps of:
forming a polysilicon filled trench in a semiconductor device substrate;
forming at least one composite layer over the trench and the substrate;
applying a mask and etch process to etch the at least one composite layer in at least one location that is adjacent to the trench;
applying a field oxide process to portions of the substrate that are exposed through the etched portions of the at least one composite layer; and
preventing a creation of a vertical bird's beak structure near the polysilicon filled trench by not placing field oxide over the polysilicon filled trench.

15. The method as set forth in claim 14 further comprising the step of:
preventing an increase in stress experienced by the polysilicon filled trench and experienced by the substrate by not placing field oxide over the polysilicon filled trench.

16. The method as set forth in claim 14 further comprising the steps of:
removing unetched portions of the at least one composite layer; and
forming a gate oxide layer over the substrate and the field oxide portions and the polysilicon filled trench.

17. The method as set forth in claim 16 further comprising the step of:
forming a polysilicon protection cap over the gate oxide layer over the polysilicon filled trench.

18. The method as set forth in claim 17 further comprising the step of:
preventing loss of portions of the gate oxide layer over the polysilicon filled trench by covering the portions of the gate oxide layer by the polysilicon protection cap.

19. The method as set forth in claim 17 further comprising the step of:
protecting the polysilicon filled trench against unwanted effects of a subsequent processing step by covering the polysilicon filled trench by the polysilicon protection cap.

20. The method as set forth in claim 19 wherein the subsequent processing step comprises silicidation.

* * * * *